United States Patent
Ehara et al.

(10) Patent No.: US 6,765,456 B2
(45) Date of Patent: Jul. 20, 2004

(54) SURFACE ACOUSTIC WAVE DUPLEXER AND PORTABLE COMMUNICATION DEVICE USING THE SAME

(75) Inventors: Hisanori Ehara, Tokyo (JP); Kazushige Noguchi, Tokyo (JP); Satoshi Terada, Tokyo (JP); Tomokazu Komazaki, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/015,606

(22) Filed: Dec. 17, 2001

(65) Prior Publication Data

US 2003/0112094 A1 Jun. 19, 2003

(51) Int. Cl.[7] .............................. H03H 9/72; H03H 9/64
(52) U.S. Cl. ...................................... 333/133; 333/193
(58) Field of Search .......................... 333/133, 193–196

(56) References Cited

U.S. PATENT DOCUMENTS

| | | | | | |
|---|---|---|---|---|---|
| 5,786,738 A | * | 7/1998 | Ikata et al. | ................ | 333/133 |
| 5,864,260 A | * | 1/1999 | Lee | .................. | 333/133 |
| 5,966,060 A | * | 10/1999 | Ikada | .................. | 333/193 |
| 5,999,069 A | * | 12/1999 | Ushiroku | ............... | 333/193 |
| 6,222,426 B1 | * | 4/2001 | Komazaki et al. | ......... | 333/133 |
| 6,313,715 B1 | * | 11/2001 | Bergmann et al. | ......... | 333/133 |
| 6,366,179 B1 | * | 4/2002 | Kuroda | .................. | 333/133 |
| 6,380,823 B1 | * | 4/2002 | Ikata et al. | ............... | 333/133 |
| 6,424,240 B1 | * | 7/2002 | Yoshikawa | ............... | 333/195 |

FOREIGN PATENT DOCUMENTS

| | | | | |
|---|---|---|---|---|
| JP | 3-297211 | * | 12/1991 | ............... 333/193 |
| JP | 4-369111 | * | 12/1992 | ............... 333/193 |
| JP | 7-38376 | * | 2/1995 | |
| JP | 08-018393 | | 1/1996 | |
| JP | 2000-068785 | | 3/2000 | |
| WO | WO 98/51010 | * | 11/1998 | |

OTHER PUBLICATIONS

U.S. patent application No. 09/450,997 filed Nov. 29, 1999.

* cited by examiner

*Primary Examiner*—Barbara Summons
(74) *Attorney, Agent, or Firm*—Rabin & Berdo, P.C.

(57) ABSTRACT

A surface acoustic wave duplexer includes a piezoelectric substrate; a transmitting filter formed on the piezoelectric substrate; a receiving filter formed on the piezoelectric substrate; a transmitting (Tx) branching line formed on the piezoelectric substrate; and a receiving (Rx) branching line formed on the piezoelectric substrate.

18 Claims, 17 Drawing Sheets

(1st EMBODIMENT)

WIDE BAND CDMA

RECEIVING MODE

FIG. 8

CONSTRUCTION OF TRANSMITTING FILTER

| | IDT(S0) | IDT(S1) | IDT(S2) | IDT(P0) | IDT(P1) | POLARIZED L |
|---|---|---|---|---|---|---|
| f00(MHz) | 2216 | 2216 | 2216 | 2124 | 2124 | 0.65(nH) |
| LPR | 0.55 | 0.55 | 0.55 | 0.55 | 0.55 | |
| CROSS LENGTH ω (um) | 40 | 20 | 40 | 42 | 42 | |
| LOGARITHM | 90 | 90 | 90 | 99 | 99 | |
| REFRECTOR | | | | | | |
| f00(MHz) | 2216 | 2216 | 2216 | 2124 | 2124 | |
| LPR | 0.55 | 0.55 | 0.55 | 0.55 | 0.55 | |
| QUANTITY | 80 | 80 | 80 | 80 | 80 | |

FIG. 9

CONSTRUCTION OF RECEIVING FILTER

|            | IDT(S0) | IDT(S2) | IDT(S3) | IDT(P0) | IDT(P1) | IDT(P2) | IDT(P3) | POLARIZED L |
|------------|---------|---------|---------|---------|---------|---------|---------|-------------|
| f00(MHz)   | 2436    | 2436    | 2436    | 2340    | 2340    | 2340    | 2340    | 0.025(nH)   |
| LPR        | 0.55    | 0.55    | 0.55    | 0.55    | 0.55    | 0.55    | 0.55    |             |
| ω(um)      | 30      | 30      | 30      | 33      | 47      | 47      | 33      |             |
| LOGARITHM  | 80      | 80      | 80      | 70      | 99      | 99      | 70      |             |
| REFLECTOR  |         |         |         |         |         |         |         |             |
| f00(MHz)   | 2436    | 2436    | 2436    | 2340    | 2340    | 2340    | 2340    |             |
| LPR        | 0.55    | 0.55    | 0.55    | 0.55    | 0.55    | 0.55    | 0.55    |             |
| QUANTITY   | 80      | 80      | 80      | 80      | 80      | 80      | 80      |             |

FIG. 10

ATTENUATION CHARACTERISTIC OF THE DUPLEXER

| | Tx-BRANCHING | Rx-BRANCHING | TRANSMITTING FILTER | | | | | | | | RECEIVING FILTER | | | | | |
|---|---|---|---|---|---|---|---|---|---|---|---|---|---|---|---|---|
| | | | 1880 (MHz) | 1910 | 1920 | 1940 | 1980 | 2075 | 2110 | 2170 | 1880 | 1940 | 1980 | 2025 | 2050 | 2110 | 2170 |
| PRIOR ART | 0 | 5.65(mm) | 12.8 | 12 | 15 | 1.63 | 1.4 | 60 | 51 | 61.5 | 43.8 | 46.1 | 55.2 | 38 | 33.3 | 3.10 | 2.80 |
| 1st EMBODIMENT | 8.75(mm) | 5.65(mm) | 12.8 | 12 | 15 | 1.63 | 1.4 | 60 | 51 | 61.5 | 38.8 | 46 | 54.4 | 34.8 | 32.8 | 2.33 | 2.45 |
| STANDERD | | | 30 | 12 | 7 | 2 | 2 | 40 | 45 | 45 | 50 | 50 | 50 | 41 | 26 | 3 | 3 |

(2nd EMBODIMENT)

FIG. 16

ATTENUATION CHARACTERISTIC OF THE SAW DUPLEXER OF WIDE BAND CDMA

| BAND | Tx-BRANCHING | Rx-BRANCHING | TRANSMITTING FILTER | | | | | | | | RECEIVING FILTER | | | | | | |
|---|---|---|---|---|---|---|---|---|---|---|---|---|---|---|---|---|---|
| | | | 1880 | 1910 | 1920 | 1940 | 1980 | 2075 | 2110 | 2170 | 1880 | 1940 | 1980 | 2025 | 2050 | 2110 | 2170 |
| PRIOR ART | 0 | 5.65(mm) | 12.8 | 12 | 15 | 1.63 | 1.4 | 60 | 51 | 61.5 | 43.8 | 46.1 | 55.2 | 36 | 33.3 | 3.68 | 3.29 |
| 1st EMBODIMENT | 8.75(mm) | 5.65(mm) | 12.8 | 12 | 15 | 1.63 | 1.4 | 60 | 51 | 61.5 | 38.8 | 46 | 54.4 | 34.8 | 32.8 | 2.33 | 2.45 |
| 2st EMBODIMENT | 3.2(nH) SERIAL | 1.8(nH) PARALLEL | 12.9 | 12 | 14.8 | 1.62 | 1.94 | 73.8 | 55.6 | 58.5 | 42.4 | 41.6 | 49.7 | 31 | 31.2 | 3.05 | 2.92 |
| STANDARD | | | 30 | 12 | 7 | 2 | 2 | 40 | 45 | 45 | 50 | 50 | 50 | 41 | 26 | 3 | 3 |

FIG. 17

ATTENUATION CHARACTERISTIC OF THE SAW DUPLEXER

| BAND | Tx-BRANCHING | Rx-BRANCHING | TRANSMITTING FILTER | | | | | | | | RECEIVING FILTER | | | | | | |
|---|---|---|---|---|---|---|---|---|---|---|---|---|---|---|---|---|---|
| | | | 1880 | 1910 | 1920 | 1940 | 1980 | 2075 | 2110 | 2170 | 1880 | 1940 | 1980 | 2025 | 2050 | 2110 | 2170 |
| PRIOR ART | 0 | 5.65(mm) | 12.8 | 12 | 15 | 1.63 | 1.4 | 60 | 51 | 61.5 | 43.8 | 46.1 | 55.2 | 36 | 33.3 | 3.10 | 2.80 |
| 2st EMBODIMENT | 3.2(nH) SERIAL | 1.8(nH) PARALLEL | 12.9 | 12 | 14.8 | 1.62 | 1.94 | 73.8 | 55.6 | 58.5 | 42.4 | 41.6 | 49.7 | 31 | 31.2 | 3.05 | 2.78 |
| STANDARD | | | 30 | 12 | 7 | 2 | 2 | 40 | 45 | 45 | 50 | 50 | 50 | 41 | 26 | 3 | 3 |

FIG. 18

SPECIFIC RESISTANCE

| MATERIAL | SPECIFIC RESISTANCE | MATERIAL | SPECIFIC RESISTANCE |
|---|---|---|---|
| 1(Au) | 1.416 | 5(PLATINUM) | 6.16 |
| 2(Al) | 1.64 | 6(TUNGSTEN) | 3.25 |
| 3(Cu) | 1 | 7(TITANIUM) | 47.8 |

FIG. 19

| NO | MATERIAL | SHAPE OF INDUCTOR(Unit:cm) | | | | | | INDUCT(nH) | SPECIFIC RESISTANCE | Q | RESISTANCE |
|---|---|---|---|---|---|---|---|---|---|---|---|
| | | H | W | LENGTH | | | | | | | |
| 1 | Au | 0.03 | 0.03 | 0.1 | 1.667 | 0.511 | 1.838 | 0.93369 | 1.416 | 48.66 | 0.117 |
| 2 | Au | 0.03 | 0.03 | 0.158 | 2.6333 | 0.9684 | 2.2462 | 1.80291 | 1.416 | 59.47 | 0.095722 |
| 3 | Au | 0.03 | 0.03 | 0.2395 | 3.9917 | 1.3844 | 2.6333 | 3.20388 | 1.416 | 69.719 | 0.08165 |

(3rd EMBODIMENT)

SURFACE ACOUSTIC WAVE DUPLEXER AND PORTABLE COMMUNICATION DEVICE USING THE SAME

TECHNICAL FIELD OF THE INVENTION

The present invention generally relates to surface acoustic wave (SAW) duplexers, and more particularly to, SAW duplexers used it portable terminals, such as mobile telephones.

BACKGROUND OF THE INVENTION

Recently, there is a demand to manufacture portable terminals that are smaller in size and lighter in weight, especially for mobile phones. For example, SAW devices have been employed in portable terminals. Such SAW duplexers have come into practical use for 800 MHz band of mobile communication, and are desired to be used for 2 GHz band communication too. It is required that a SAW duplexer has a high level attenuation in an attenuation band.

A conventional SAW duplexer includes a transmitting filter, a receiving filter and a branching circuit (branching line). The transmitting filter and receiving filter are applied with 1 to 2 watt and 1 watt of electric power, respectively. Therefore, the transmitting filter and receiving filter are required to have a power-resistance characteristic. The transmitting filter is composed of four-section T-type filter, having polarization characteristic. The receiving filter is composed of six-section π ladder-type filter, a polarization characteristic. According to the above-described conventional SAW duplexer, the receiving filter is influenced by impedance of the transmitting filter especially in a transmitting band of 1920–1980 MHz and a receiving band of 2110–2170 MHz. As a result, it is difficult to make the receiving filter so as to have an insertion loss within a predetermined allowable standard range.

Further, according to the conventional SAW duplexer, the transmitting filter and receiving filter are mounted in a multi-layered substrate package. As a result, it is almost impossible after fabrication to adjust or control characteristics of the transmitting filter and receiving filter, including insertion loss and coupling between adjacent transmitting lines.

OBJECTS OF THE INVENTION

Accordingly, it is an object of the present invention to provide a SAW duplexer in which characteristics can be remarkably improved.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a surface acoustic wave duplexer includes a piezoelectric substrate; a transmitting filter formed on the piezoelectric substrate; a receiving filter formed on the piezoelectric substrate; a transmitting (Tx) branching line formed on the piezoelectric substrate; and a receiving (Rx) branching line formed on the piezoelectric substrate.

According to a second aspect of the present invention, a portable communication device includes an antenna, a power amplifier, and a surface acoustic wave duplexer. The surface acoustic wave duplexer includes (1) a piezoelectric substrate; (2) a transmitting filter which is formed on the piezoelectric substrate and is connected to the power amplifier; (3) a receiving filter which is formed on the piezoelectric substrate; (4) a transmitting (Tx) branching line which is formed on the piezoelectric substrate and is connected between the antenna and transmitting filter; and (5) a receiving (Rx) branching line which is formed on the piezoelectric substrate and is connected between the antenna and receiving filter.

BRIEF DESCRIPTION OF THE DRAWINGS

FIG. 8 is a table showing the specification of the transmitting filter used in the SAW duplexer according to the first preferred embodiment shown in FIG. 2.

FIG. 9 is a table showing the specification of the transmitting filter used in the SAW duplexer according to the first preferred embodiment shown in FIG. 2.

FIG. 10 is a table showing characteristics of the conventional SAW duplexer, shown in FIG. 1, and the SAW duplexer according to the first preferred embodiment shown in FIG. 2.

FIG. 16 is a table showing characteristics of the conventional SAW duplexer shown in FIG. 1, and the SAW duplexers according to the first and second preferred embodiments.

FIG. 17 is a table showing characteristics of the conventional SAW duplexer shown in FIG. 1, and the SAW duplexers according to the second preferred embodiment, shown in FIGS. 14 and 15.

FIG. 18 is a table showing specific resistances of the metals Au, Al, platinum, tungsten and titanium, relative to Cu.

FIG. 19 is a table showing specification of inductors for branching lines used in the SAW duplexers according to the second preferred embodiment shown in FIGS. 14 and 15.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
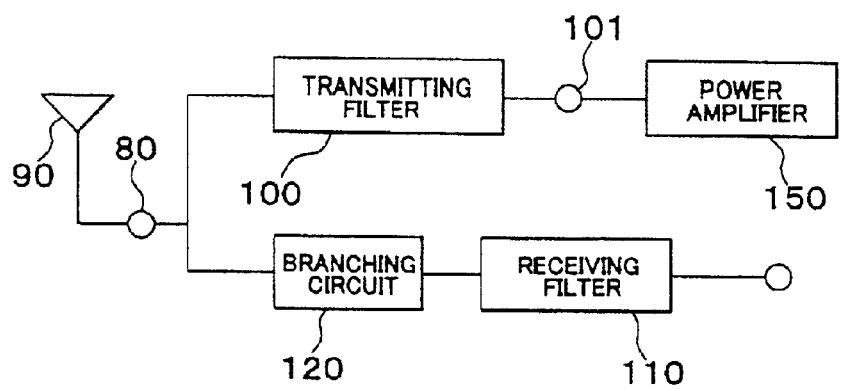
FIG. 1 is a block diagram illustrating a conventional SAW duplexer.

For better understanding of the present invention, a conventional technology is first described. FIG. 1 is a block diagram illustrating a conventional SAW duplexer, which includes a transmitting filter 100, a receiving filter 110 and a branching circuit (branching line) 120. The transmitting filter is connected between a terminal 101 and an antenna terminal 80, the latter connected to an antenna 90. The branching circuit 120 is connected between the antenna terminal 80 and receiving filter 110. The terminal 101 is connected to a power amplifier 150, which is a final part of a radio frequency (RF) circuit in a mobile phone.

The transmitting filter 100 and receiving filter 110 are supplied with 1–2 watt and 1 watt of electric power, respectively. Therefore, the transmitting filter 100 and receiving filter 110 are required to have power-resistance characteristic. The transmitting filter 100 is composed of a four-section T-type filter, having a polarization characteristic. The receiving filter 110 is composed of a six-section π ladder-type filter, also having a polarization characteristic.

According to the above-described conventional SAW duplexer shown in FIG. 1, the receiving filter 110 is influenced by the impedance of the transmitting filter 100 especially in a transmitting band of 1920–1980 MHz and a receiving band of 2110–2170 MHz. As a result, it is difficult to limit the receiving filter 110 to an insertion loss within a predetermined allowable standard range.

Further, according to the conventional SAW duplexer, the transmitting filter 100 and receiving filter 110 are contained in a multi-layered substrate package. As a result, it is impossible to adjust or control characteristics of the transmitting filter 100 and receiving filter 110, including insertion loss and coupling between adjacent transmitting lines.

First Preferred Embodiment

Figure 2:
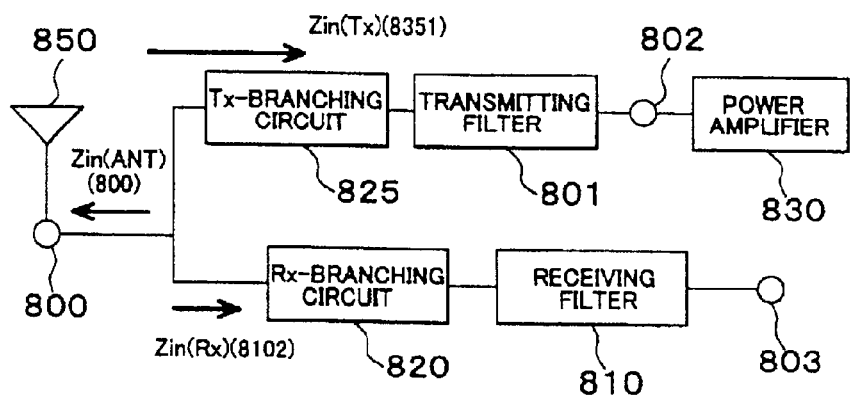
FIG. 2 is a block diagram illustrating a SAW duplexer according to a first preferred embodiment of the present invention.

FIG. 2 is a block diagram illustrating a SAW duplexer according to a first preferred embodiment of the present invention. The SAW duplexer includes a transmitting filter 801, a receiving filter 810, a Tx-branching circuit (branching line) 825 (which rotates (adjusts) the reflected signal phase at the junction, and an Rx-branching circuit (branching line) 820 (which likewise rotates (adjusts) the reflected signal phase at the junction). FIG. 2 shows not only the SAW duplexer, but also other components of a mobile terminal. The transmitting filter is connected between the Tx-branching circuit 825 and a terminal 802, which is connected to a power amplifier 830. The receiving filter 810 is connected between the Rx-branching circuit 820 and a terminal 803. The Tx-branching circuit 825 and the Rx-branching circuit 820 are connected to an antenna terminal 800, the latter connected to an antenna 850. The SAW duplexer (801, 810, 820 and 825) is formed on a piezoelectric substrate.

Figure 3:
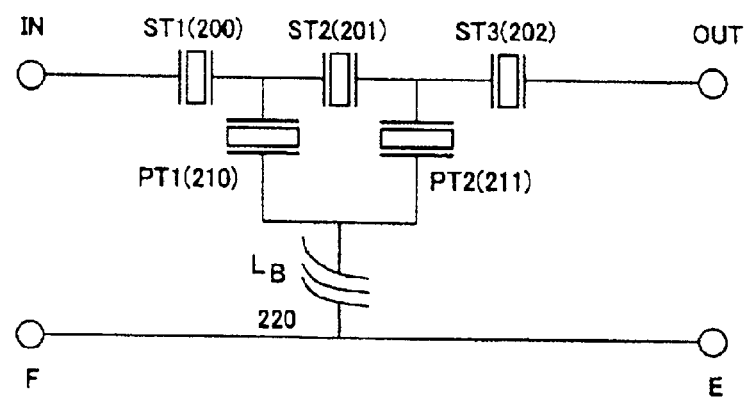
FIG. 3 is a circuit diagram showing a transmitting filter used in the SAW duplexer according to the first preferred embodiment shown in FIG. 2.
Figure 4:
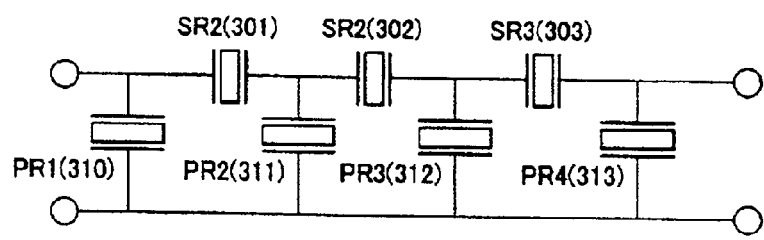
FIG. 4 is a circuit diagram showing a receiving filter used in the SAW duplexer according to the first preferred embodiment shown in FIG. 2.
Figure 5:
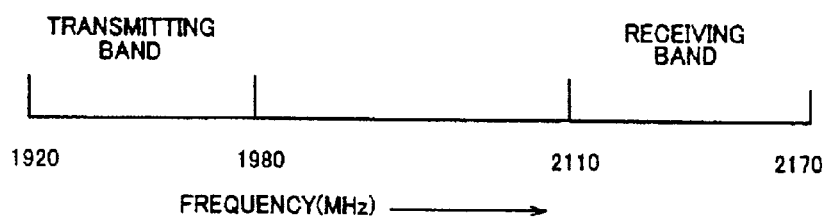
FIG. 5 is a diagram showing communication band distribution for the SAW duplexer according to the first preferred embodiment shown in FIG. 2.

FIGS. 3 and 4 are circuit diagrams showing the transmitting filter 801 and receiving filter 810, respectively. The transmitting filter 801 is of a four-section T-type and polarized type, including resonators 200–202, 210 and 211. For each resonator, characteristics of cross-length, logarithm and resonance frequency are shown in FIG. 8. The receiving filter 810 is of a six-section π ladder type, including resonators 301–303, and 310–313. For each resonator, characteristics of cross-length; logarithm and resonance frequency are shown in FIG. 9.

Figure 6:
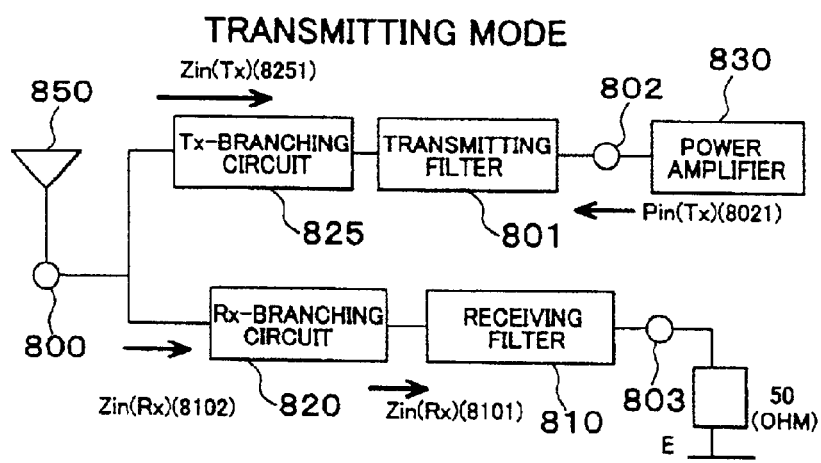
FIG. 6 is a block diagram illustrating the SAW duplexer operating in a transmitting mode according to the first preferred embodiment shown in FIG. 2.

FIG. 6 is a block diagram illustrating the SAW duplexer operating in a transmitting mode according to the first preferred embodiment, shown in FIG. 2. In a transmitting mode, the power amplifier 830 supplies a transmitting power signal Pin(Tx) 8021 to an input terminal of the transmitting filter 801. The inputted power signal is transmitted through the transmitting filter 801 and Tx-branching line 825, and then, the signal is transmitted from the antenna 850. In this case, the Rx branching line 820, receiving filter 810 and antenna 850 form a load circuit defining a load (impedence) $Z_L(Tx)$, which is calculated by the following equation (1):

$$Z_L(Tx)=(Zin(ANT)*Zin(Rx\text{-branch}))/(Zin(ANT)+Zin(Rx\text{-branch})) \quad (1)$$

Input impedance of the receiving filter 810 in the transmission band is approximated at zero. The length of the Rx-branching line 820 (and therefore the phase of signal at the junction of branching of the branching lines 820 of 825) is adjusted so that input impedance Zin(Rx) 8102 of the Rx-branching line 820 is approximated to the infinite. Generally, the line length of the Rx-branching line 820 is λ/4. In this case, $Z_L(Tx)$ is calculated by the following equation (2), which shows that a load of the transmitting filter 801 is equal to input impedance of the antenna 850:

$$Z_L(Tx)=Zin(ANT) \quad (2)$$

According to another aspect, input impedance Zin(Rx) 8102 of the Rx-branching line 820 is not approximated to the infinite, but the length of the Rx-branching line 820 is determined so as to reduce loss of the transmitting filter 801. The impedance Zin(Rx-branch) 8102 is determined so that the load circuit with load $Z_L(TX)$ meets the following equation (3):

$$Z_L(TX)=50(OHM) \quad (3)$$

Figure 7:
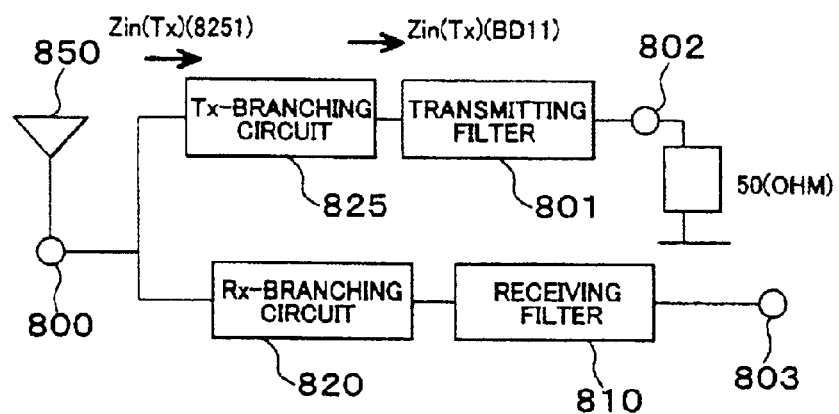
FIG. 7 is a block diagram illustrating the SAW duplexer operating in a receiving mode according to the first preferred embodiment shown in FIG. 2.

FIG. 7 is a block diagram illustrating the SAW duplexer operating in a transmitting mode according to the first preferred embodiment, shown in FIG. 2. In a receiving mode, an input power Pin(Rx) 8021 is received at the antenna 850 and is supplied to the antenna terminal 800. In this case, driving impedance $Z_D(Rx)$ of the receiving filter 810 is calculated by the following equation (4):

$$Z_D(Rx)=(Zin(ANT)*Zin(Tx\text{-branch})/(Zin(ANT)+Zin(Tx\text{-branch}) \quad (4)$$

As well as the case shown in FIG. 6, input impedance of Zin(Tx-branch) 8251 in the receiving band is approximated to infinite. The driving impedance $Z_D(Rx)$ for Rx-branching circuit 820 and receiving filter 810 is calculated by the following equation (5):

$$Z_D(Rx)=Zin(ANT) \quad (5)$$

In this case, the impedance of the antenna 850 becomes the driving impedance $Z_D(Rx)$, so that characteristics of the receiving filter 810 may be changed. In order to avoid such change of characteristics of the receiving filter 810, the driving impedance $Z_D(Rx)$ should be determined as follows:

$$Z_D(Rx)=50(OHM) \quad (6)$$

FIG. 8 is a table showing the specification of the transmitting filter 801. In the table, cross-length, logarithm and resonance frequency are described for each resonator.

FIG. 9 is a table showing the specification of the receiving filter 810. In the table, cross-length, logarithm and resonance frequency are described for each resonator.

FIG. 10 is a table showing characteristics of the conventional SAW duplexer shown in FIG. 1, and the SAW duplexer according to the first preferred embodiment shown in FIG. 2. The characteristics of transmitting filters are the same as between the conventional SAW duplexer and first preferred embodiment. As for the receiving filters, insertion loss is decreased from 3.10 (dB) for the conventional SAW duplexer to 2.33 (dB) for the first preferred embodiment.

Figure 11:
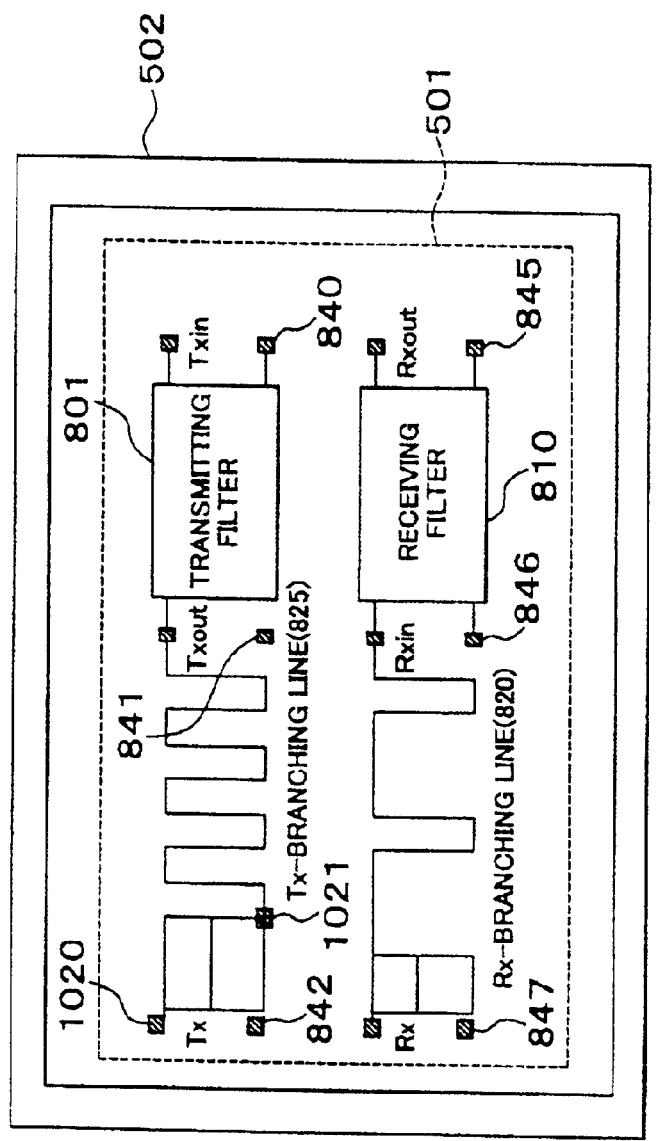
FIG. 11 is a schematic diagram showing the SAW duplexer according to the first preferred embodiment, shown in FIG. 2.

FIG. 11 is a schematic diagram showing the SAW duplexer according to the first preferred embodiment shown in FIG. 2, in which the Tx-branching line 825 and Rx-branching line 820 are formed on a piezoelectric substrate 501 together with the receiving filter 810. The piezoelectric substrate 501 is formed to have a substrate-thickness of 0.35 mm, a film-thickness of 0.4 μm, a dielectric constant of forty-four and a frequency of 2 GHz. Under such conditions, the Tx-branching line 825 and Rx-branching line 820 are formed to have lengths of 8.75 mm and 5.65 mm, as shown in FIG. 10.

Each of the Tx-branching line 825 and Rx-branching line 820 is formed to have a width of 0.042 mm. According to the first preferred embodiment, the Tx-branching line 825 and Rx-branching line 820 are formed on a piezoelectric substrate, so that connecting lines can be shorter. As a result, characteristics of the device are not easily deteriorated. As compared to the conventional SAW duplexer, a piezoelectric substrate has a dielectric constant of forty-four (44), while a multi-layered substrate has a dielectric constant of 5.7; and therefore, the branching line 820 can use a λ/4 line having a length 1/2.77 relative to a branching line used in the conventional SAW duplexer, which is a multi-layered type.

According to the conventional SAW duplexer, shown in FIG. 1, the branching line is formed on an intermediate layer in a multi-layered package, so that the branching line cannot be adjusted. Therefore, it is difficult to improve the characteristics of SAW duplexers. According to the first preferred embodiment, the branching lines 820 and 825 can be adjusted in length.

Figure 12:
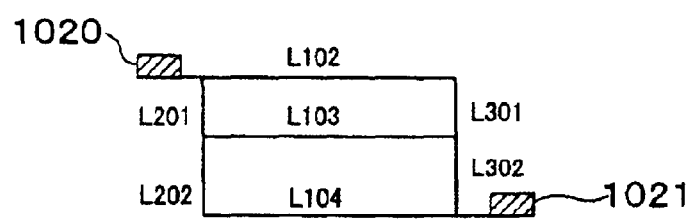
FIG. 12 is a schematic diagram showing an adjusting part of a Tx-branching line, which can be changed in length, used in the SAW duplexer according to the first preferred embodiment shown in FIGS. 2 and 11.

FIG. 12 is a schematic diagram showing an adjusting part 842 of the Tx-branching line 825, which can be changed in length, used in the SAW duplexer according to the first preferred embodiment, shown in FIGS. 2 and 11. In FIG. 12, when L102=L103=L104=1 mm and L201=L202=L301=L302=0.5 mm, the line length between terminals 1020 and 1021 would be in a range between 0.467 mm and 4.0 mm.

Figure 13:
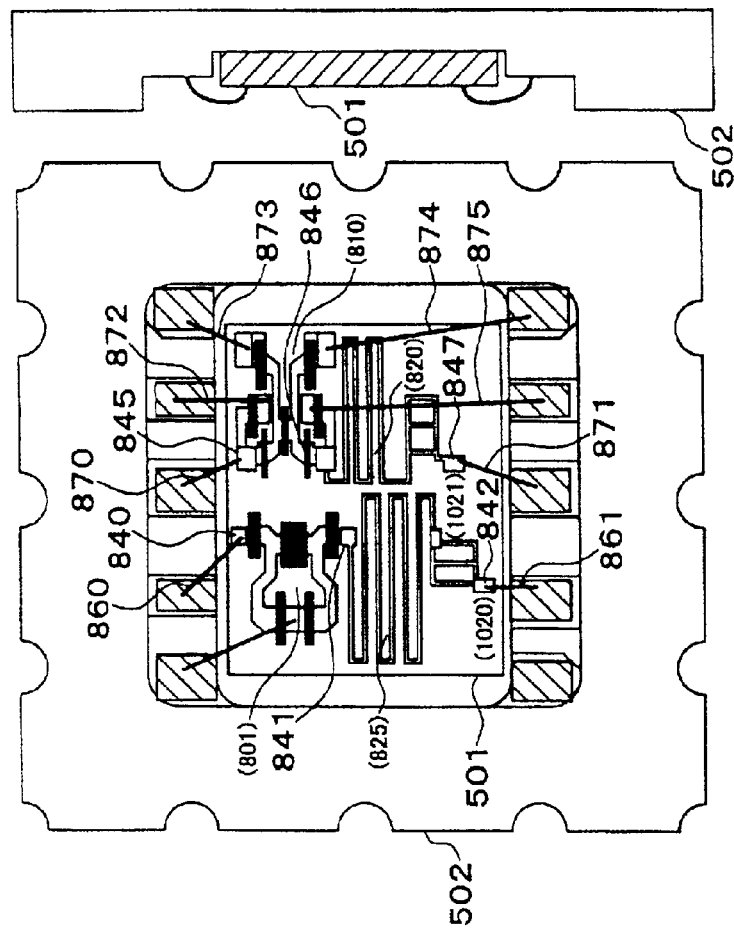
FIG. 13 is a schematic diagram showing an actual design of the SAW duplexer according to the first preferred embodiment shown in FIGS. 2 and 11.

FIG. 13 is a schematic diagram showing an actual design of the SAW duplexer formed on a piezoelectric substrate, according to the first preferred embodiment shown in FIGS. 2 and 11. In FIG. 13, a piezoelectric substrate 501 is mounted on a package 502. The transmitting filter 801 is of four-section T type and polarized type, while the receiving filter 810 is of six-section π ladder type. The Tx-branching line 825 is provided with terminals 841 and 842 having a line length therebetween of 8.75 mm. The Rx-branching line 820 is provided with terminals 846 and 847 having a line length therebetween of 5.65 mm. Each of the Tx-branching line 825 and Rx-branching line 820 includes the length-adjusting portion shown in FIG. 12.

The package 502 and piezoelectric substrate 501 are connected to each other with bonding wires. The transmitting filter 801 is connected at an input terminal 840 with a bonding wire 860, and at the output terminal 842 with a bonding wire 861. The receiving filter 810 is connected at an input terminal 845 with a bonding wire 870, and at the output terminal 847 with a bonding wire 871. Bonding wires 862, 872. 873, 874 and 875 are used to ground terminals of parallel resonators in the transmitting and receiving filters 810 and 801.

According to the conventional SAW duplexer of multi-layered type, it is important to improve accuracy of connecting lines, thickness of each layer and arrangement of each layer of substrate in order to maintain a high attenuation characteristic. On the other hand, according to the above-described first preferred embodiment, it is easy to maintain high attenuation characteristic of SAW duplexers.

According to the first preferred embodiment, in bands of 2110 MHz and 2170 MHz of the receiving filter 801, insertion losses are 0.77 dB and 0.35 dB, respectively. Further, the Tx-branching line 825 and Rx-branching line 820 are formed on a piezoelectric substrate, so that connecting lines can be shorter. As a result, characteristics of the SAW duplexer, including insertion loss and coupling of transmitting lines, are reduced.

Second Preferred Embodiment

Figure 14:
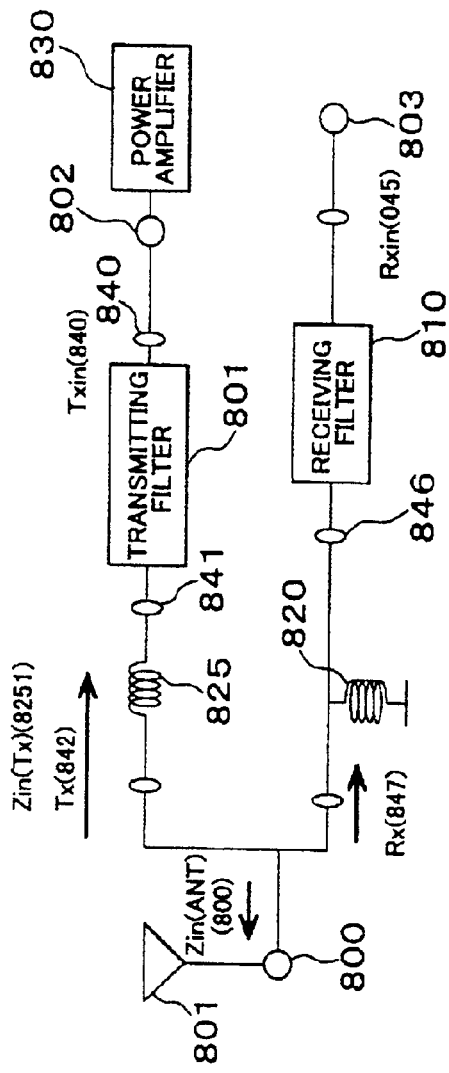
FIG. 14 is a block diagram illustrating a SAW duplexer according to a second preferred embodiment of the present invention.

FIG. 14 is a block diagram illustrating a SAW duplexer according to a second preferred embodiment of the present invention. In this embodiment the same or corresponding elements to those in the first preferred embodiment are represented by the same reference numerals, and the same description is not repeated to avoid redundancy. According to the second preferred embodiment, Tx-branching line 825 and Rx-branching line 820 are formed by inductors (inductance coils).

Figure 15:
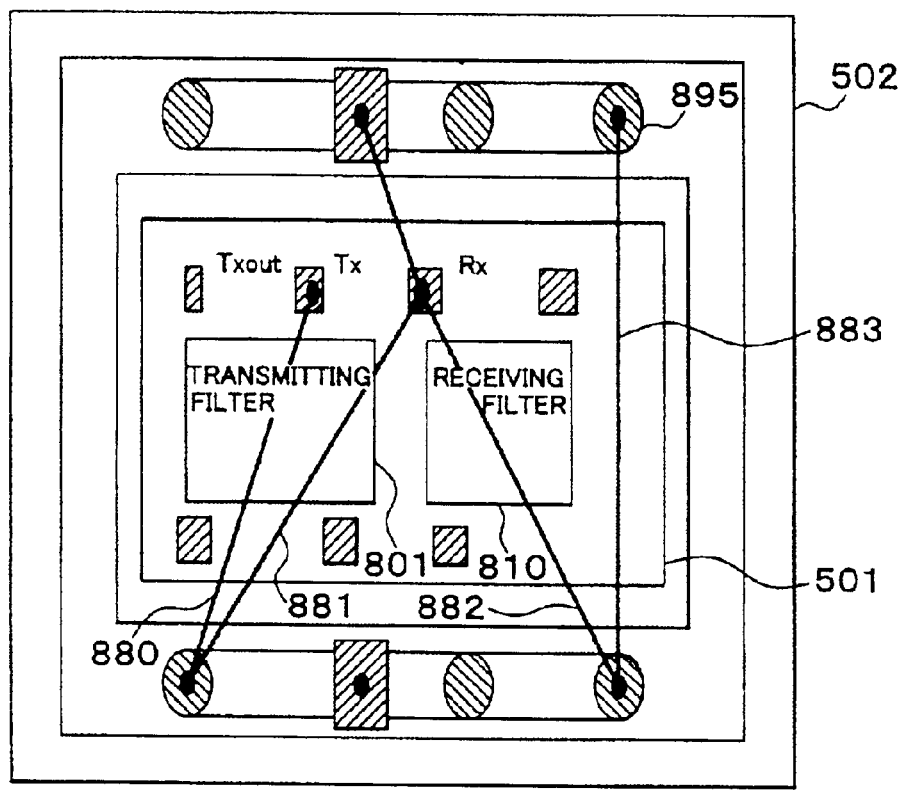
FIG. 15 is a schematic diagram showing the SAW duplexer according to the second preferred embodiment, shown in FIG. 14.

FIG. 15 is a schematic diagram showing the SAW duplexer according to the second preferred embodiment, shown in FIG. 14. As shown in FIG. 15, the Tx-branching line 825 and Rx-branching line 820 are formed by bonding wires. When a 3.2 nH of inductor (825) is serially connected as the Tx-branching line 825, and a 1.8 nH of inductor (820) is connected as the Rx-branching line 820 between the receiving filter 810 and the ground, characteristics shown in FIGS. 16 and 17 are obtained.

Now, a method for realize a polarized impedance is described. An inductance value L (nH) for an inductor having height "h", width "w" and length "l" and a Q value "Q" are calculated by the following equations (6) and (7), where "K" is a constant; "ρ" is a specific resistance and ρ(Cu) is the specific resistance of Copper:

$$L(\text{nH})=5.08*10^{-3}*l*(Ln(l/(W+h))+1.193+0.2235((W+h)/l) \quad (6)$$

$$Q=2.15*10^{3}*(L*W/K*l))*((\rho(Cu)/\rho)*(f(\text{GHz})/2)^{-5} \quad (7)$$

FIG. 18 is a table showing specific resistances of metals of Au, Al, platinum, tungsten and titanium relative to Cu.

FIG. 19 is a table showing the specification of inductors for branching lines 825 and 820 used in the SAW duplexers according to the second preferred embodiment shown in FIGS. 14 and 15. In the table shown in FIG. 18, column No. 1 shows a shape of an inductor when an "L" value of one is provided using Au (gold) as a material. Columns No. 2 and No. 3 respectively show shapes of inductors when "L" values of 3.2 nH for the Tx-branching line 825 and 1.8 nH for the Rx-branching line 820 are provided using Au (gold) as a material for the inductors.

As shown in FIG. 17, according to the second preferred embodiment, the insertion loss for the receiving filter 810 is 0.05 dB less than that of the first preferred embodiment; however, the attenuation amount for the transmitting filter 801 is about 5 dB greater than that of the first preferred embodiment. Although, according to the second preferred embodiment, the branching lines are formed only by inductors, the inductors can be formed on a piezoelectric substrate. Further, such inductors can be formed by distributed constant lines.

Figure 20:
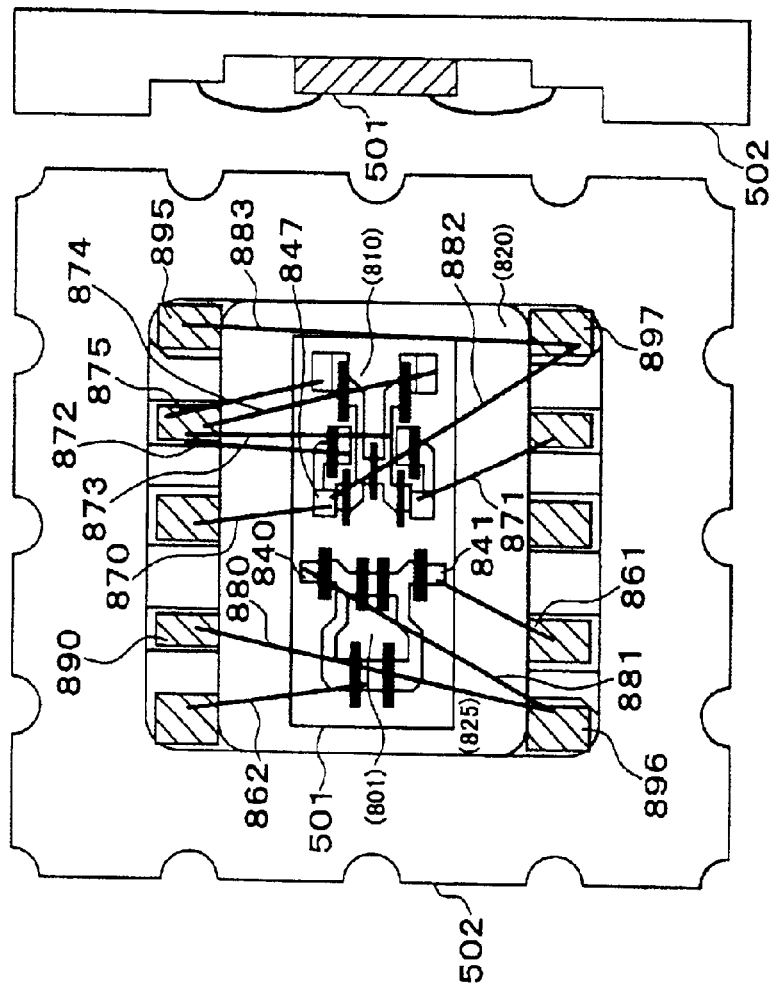
FIG. 20 is a schematic diagram showing an actual design of the SAW duplexer according to the second preferred embodiment shown in FIGS. 14 and 15.

FIG. 20 is a schematic diagram showing an actual design of the SAW duplexer according to the second preferred embodiment, shown in FIGS. 14 and 15. In FIG. 20, a piezoelectric substrate 501 is mounted on a package 502. The transmitting filter 801 is of a four-section T type and polarized type, while the receiving filter 810 is of a six-section π ladder type. The Tx-branching line 825 is designed to have an inductor value of 3.2 nH between a package terminal 890 and an input terminal 840. The Rx-branching line 820 is designed to have an inductor value of 1.8 nH between a terminal 847 and a package terminal 895.

The package 502 and piezoelectric substrate 501 are connected to each other with bonding wires. The transmitting filter 801 is connected at an input terminal with bonding wires 880 and 881, and at the output terminal with bonding wire 871. The receiving filter 810 is connected at an input terminal with a bonding wire 870, and at an output terminal with a bonding wire 871. Bonding wires 862, 872, 873, 874 and 875 are used to ground terminals of parallel resonators in the transmitting and receiving filters 810 and 801. Package terminals 896 and 897 are connecting terminals that are necessary to form a branching line L. A package terminal 895 is grounded.

The inductance 3.2 nH of the Tx-branching line L (825) is formed by the bonding wires 880 and 881 via the connecting terminal 896. The inductance 1.8 nH of the Rx-branching line L (820) is formed by the bonding wires 882 and 883 via the connecting terminal 897.

According to the above-described second preferred embodiment, branching lines 820 and 825 are formed by bonding wires, so that the characteristics can be adjusted easily.

Third Preferred Embodiment

Figure 21:
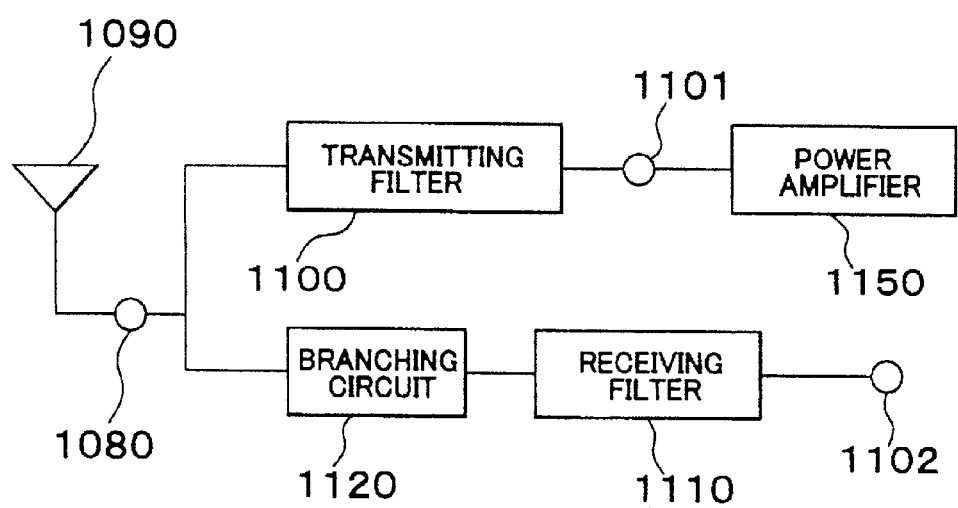
FIG. 21 is a block diagram illustrating a SAW duplexer according to a third preferred embodiment of the present invention.

FIG. 21 is a block diagram illustrating a SAW duplexer according to a third preferred embodiment of the present invention. As described above, the first and second preferred embodiments are generally used for improving characteristics of a duplexer in which the transmitting band and receiving band are widely separated from each other, such as a wide band CDMA. The third preferred embodiment can be used to miniaturize a duplexer for an 800 MHz band CDMA. The duplexer includes an antenna 1090, an antenna terminal 1080, a transmitting filter 1100, a branching circuit (branching line) 1120, a receiving filter 1110 and a power amplifier 1150. The transmitting filter 1100 is connected between the antenna terminal 1080 and a terminal 1101. The branching circuit 1120 is connected between the antenna terminal 1080 and the receiving filter 1110. The power amplifier 1150 and receiving filter are connected to terminals 1101 and 1102, respectively.

In the third preferred embodiment, the branching line 1120 is designed to have a width of 0.043 mm, and a length of 17.96 mm. The width and length of the branching line 1120 is decided based on a condition in which a piezoelectric substrate has a thickness of 0.35 mm, a film-thickness of 0.4 µm, a dielectric constant of forty-four and a frequency of 836 MHz.

According to the third preferred embodiment as compared to the conventional SAW duplexer, the SAW duplexer can be designed smaller in size and have better characteristics.

What is claimed is:

1. A surface acoustic wave duplexer, comprising:
   a piezoelectric substrate;
   a transmitting filter formed on the piezoelectric substrate;
   a receiving filter formed on the piezoelectric substrate;
   a transmitting (Tx) phase-rotating line formed on the piezoelectric substrate; and
   a receiving (Rx) phase-rotating line formed on the piezoelectric substrate, wherein the transmitting phase-rotating line and receiving phase-rotating line are formed with bonding wires.

2. A portable communication device, comprising:
   a piezoelectric substrate;
   a transmitting filter formed on the piezoelectric substrate;
   a receiving filter formed on the piezoelectric substrate;
   a transmitting (Tx) phase-rotating line formed on the piezoelectric substrate; and
   a receiving (Rx) phase-rotating line formed on the piezoelectric substrate, wherein the transmitting phase-rotating line and receiving phase-rotating line are formed with bonding wires.

3. A surface acoustic wave duplexer, comprising:
   a piezoelectric substrate;
   a transmitting filter formed on the piezoelectric substrate;
   a receiving filter formed on the piezoelectric substrate;
   a transmitting (Tx) branching circuit formed on the piezoelectric substrate and having a plurality of branching lines coupled in parallel with each other; and
   a receiving (Rx) branching circuit formed on the piezoelectric substrate.

4. A surface acoustic wave duplexer, according to claim 3, wherein the transmitting branching circuit is adjusted in its length to change a predetermined characteristic.

5. A surface acoustic wave duplexer, according to claim 3, wherein the transmitting branching circuit is formed by inductors.

6. A surface acoustic wave duplexer, according to claim 3, wherein the transmitting branching circuit is formed with bonding wires.

7. A portable communication device, comprising:
   an antenna;
   a power amplifier; and
   a surface acoustic wave duplexer, wherein the surface acoustic wave duplexer comprises:
   (1) a piezoelectric substrate;
   (2) a transmitting filter formed on the piezoelectric substrate;
   (3) a receiving filter formed on the piezoelectric substrate;
   (4) a transmitting (Tx) branching circuit formed on the piezoelectric substrate and having a plurality of branching lines coupled in parallel with each other; and (5) a receiving (Rx) branching circuit formed on the piezoelectric substrate.

8. A portable communication device according to claim 7, wherein the transmitting branching circuit is adjusted in its length to change a predetermined characteristic.

9. A portable communication device according to claim 7, wherein the transmitting branching circuit is formed by inductors.

10. A portable communication device according to claim 7, wherein the transmitting branching circuit is formed with bonding wires.

11. A surface acoustic wave duplexer, comprising:
a piezoelectric substrate;
a transmitting filter formed on the piezoelectric substrate;
a receiving filter formed on the piezoelectric substrate;
a transmitting (Tx) branching circuit formed on the piezoelectric substrate; and
a receiving (Rx) branching circuit formed on the piezoelectric substrate and having a plurality of branching lines coupled in parallel with each other.

12. A surface acoustic wave duplexer, according to claim 11, wherein the receiving branching circuit is adjusted in its length to change a predetermined characteristic.

13. A surface acoustic wave duplexer, according to claim 11, wherein the receiving branching circuit is formed by inductors.

14. A surface acoustic wave duplexer, according to claim 11, wherein the receiving branching circuit is formed with bonding wires.

15. A portable communication device, comprising:

an antenna;

a power amplifier; and a surface acoustic wave duplexer, wherein the surface acoustic wave duplexer includes:
(1) a piezoelectric substrate;
(2) a transmitting filter formed on the piezoelectric substrate;
(3) a receiving filter formed on the piezoelectric substrate;
(4) a transmitting (Tx) branching circuit formed on the piezoelectric substrate; and
(5) a receiving (Rx) branching circuit formed on the piezoelectric substrate and having a plurality of branching lines coupled in parallel with each other.

16. A portable communication device according to claim 15, wherein the receiving branching circuit is adjusted in its length to change a predetermined characteristic.

17. A portable communication device according to claim 15, wherein the receiving branching circuit is formed by inductors.

18. A portable communication device according to claim 15, wherein the receiving branching circuit is formed with bonding wires.

* * * * *